(12) United States Patent
Grund

(10) Patent No.: US 7,705,622 B1
(45) Date of Patent: Apr. 27, 2010

(54) METHOD TO SYNCHRONIZE TWO DIFFERENT PULSE GENERATORS

(76) Inventor: Evan Grund, 5932 Amapola Dr., San Jose, CA (US) 95129

( * ) Notice: Subject to any disclaimer, the term of this patent is extended or adjusted under 35 U.S.C. 154(b) by 0 days.

(21) Appl. No.: 12/325,263

(22) Filed: Nov. 30, 2008

Related U.S. Application Data

(60) Provisional application No. 61/004,920, filed on Dec. 3, 2007.

(51) Int. Cl.
  *G01R 31/26* (2006.01)

(52) U.S. Cl. ...................................... 324/765
(58) Field of Classification Search ................. 324/765, 324/96, 456, 678, 605, 537, 534, 158.1; 333/109, 333/32; 714/755, 724, 715, 733; 258/48; 437/14–18
See application file for complete search history.

(56) References Cited

U.S. PATENT DOCUMENTS

| | | | | |
|---|---|---|---|---|
| 5,519,327 | A | * | 5/1996 | Consiglio ................... 324/678 |
| 5,804,977 | A | * | 9/1998 | Consiglio ................... 324/678 |
| 7,239,165 | B2 | * | 7/2007 | Maloney et al. ............. 324/765 |

* cited by examiner

*Primary Examiner*—Ha Tran T Nguyen
*Assistant Examiner*—Tung X Nguyen

(57) ABSTRACT

This invention generates two pulses for semiconductor testing that have leading edges coordinated in time by synchronizing the pulses from two different styles of pulse generators (pulsers). One pulser uses spark discharge pulse generation and the other pulser is a typical solid state pulser. The spark discharge pulser has high power pulse generation but its pulse timing can not be tightly controlled. The output pulse of the spark discharge pulser is split unequally, with a small amount used to trigger the solid state pulser, and the large pulse energy delayed by a cable of length for a signal propagation delay equal or greater than the trigger-input-to-pulse-output delay of the solid state pulser. Variable attenuators control the trigger signal amplitude and a level shifting circuit makes the trigger signal compatible with standard logic signal levels. The two pulses can be applied to semiconductors with their leading edges adjustable relative to each other to measure the semiconductors operation.

17 Claims, 5 Drawing Sheets

Drawing of the present invention using two pulsers

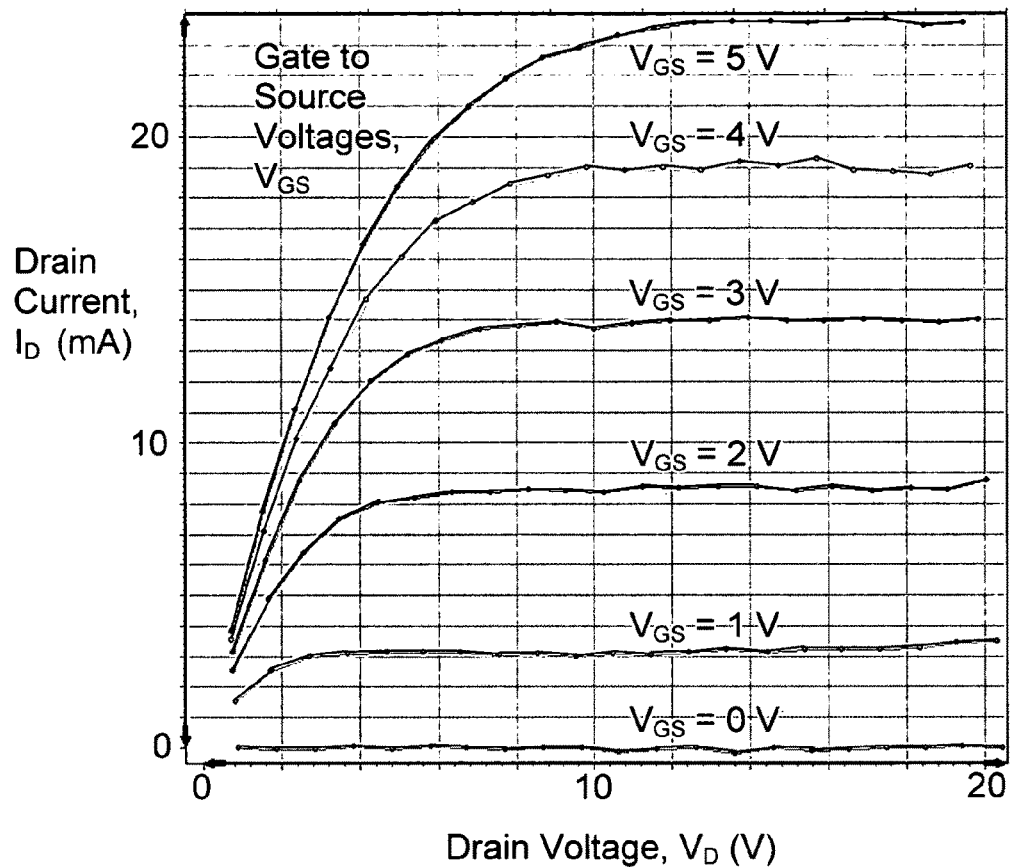
Fig. 1: Example of transistor parameter measurements with a family of curves of drain current as a function of drain voltage with different gate voltages

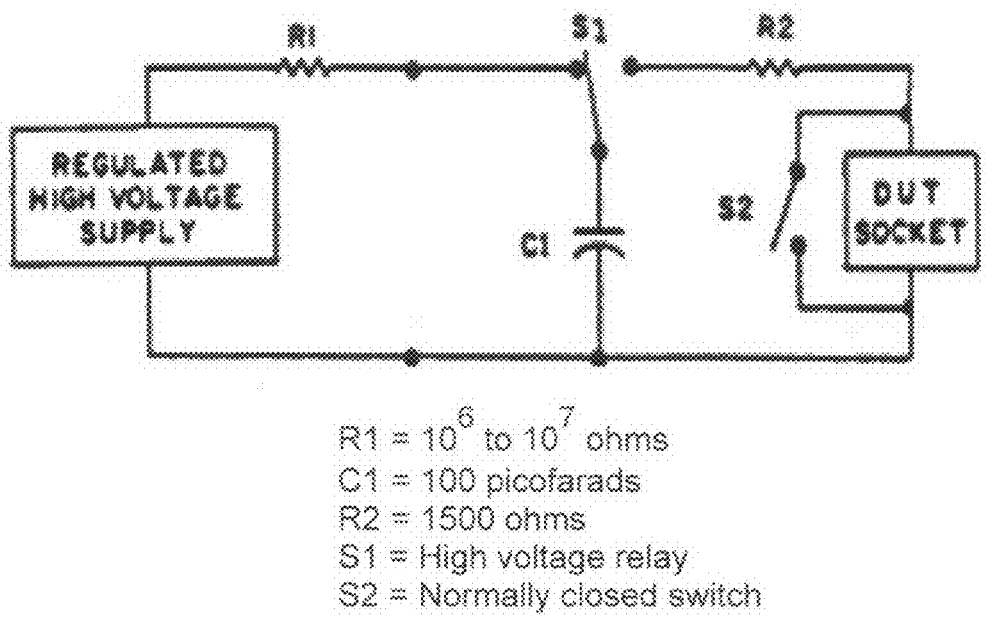
Fig. 2: Prior art pulse generator example from MIL-STD-883C Method 3015.7
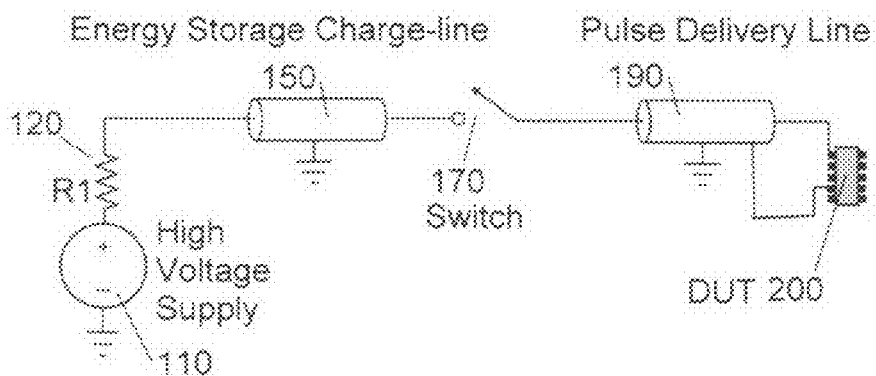
Fig. 3: Prior art simplified Transmission Line Pulser diagram

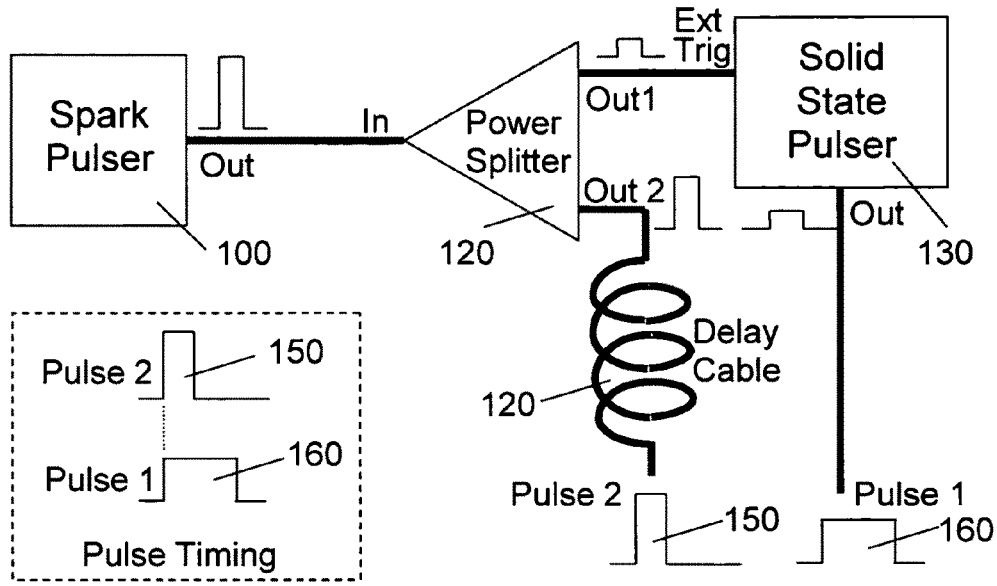
Fig. 4: Drawing of the present invention using two pulsers
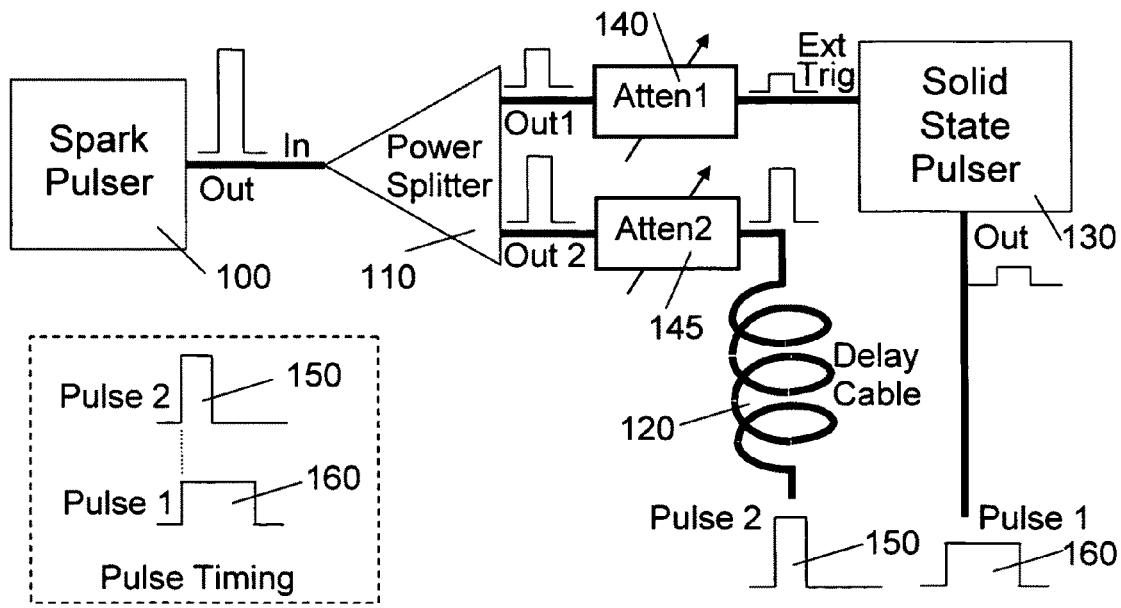
Fig. 5: An embodiment with variable attenuators on the outputs of the power splitter

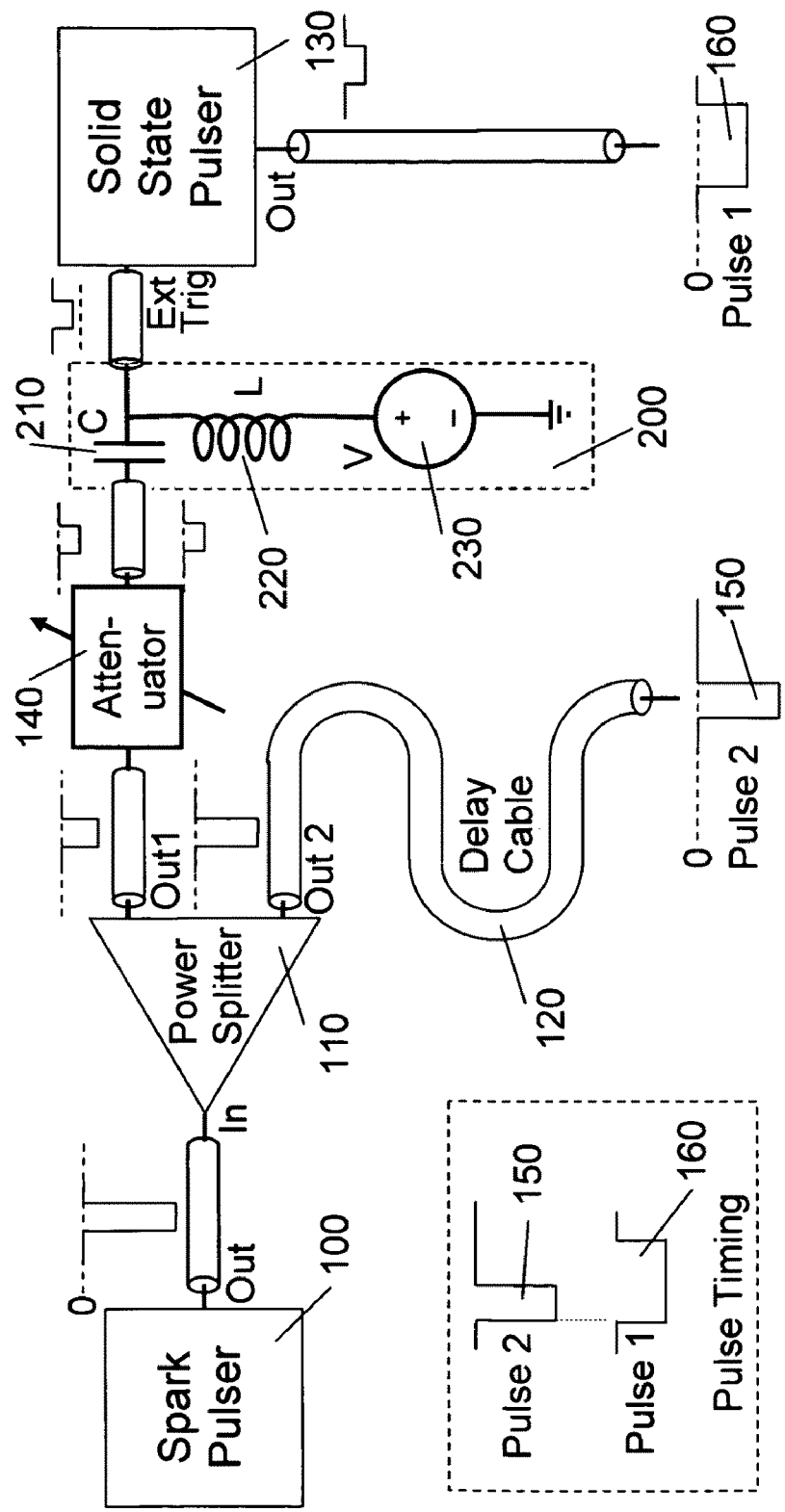
Fig. 6: An embodiment with a trigger level shifter

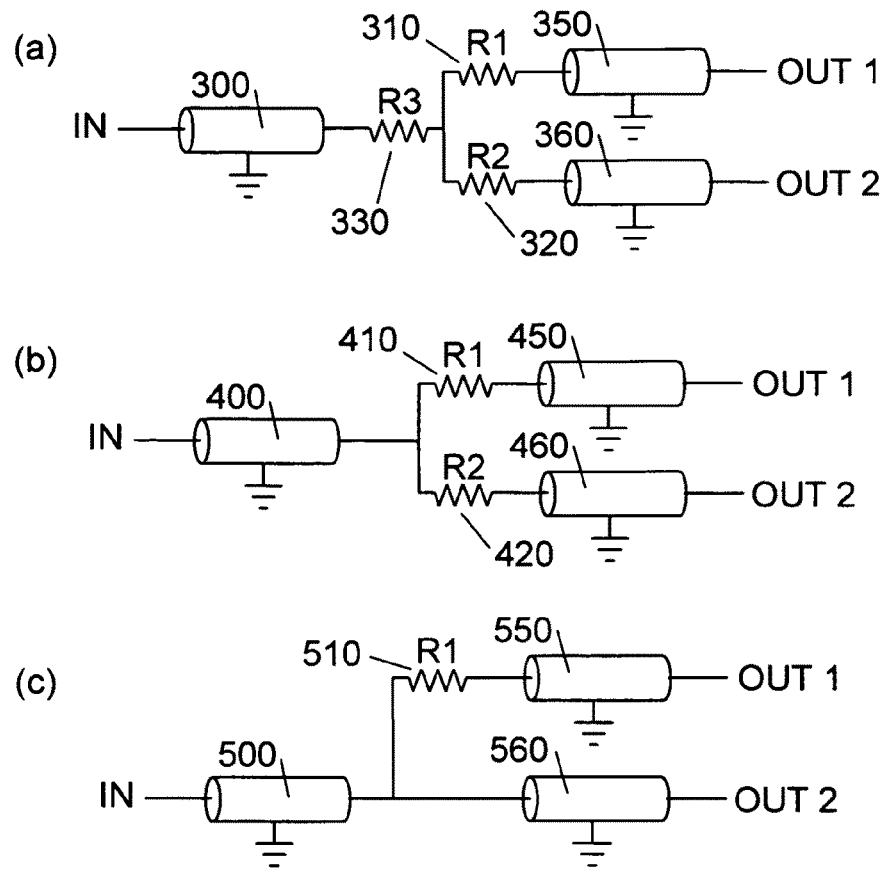
Fig. 7: Examples of resistive power splitters
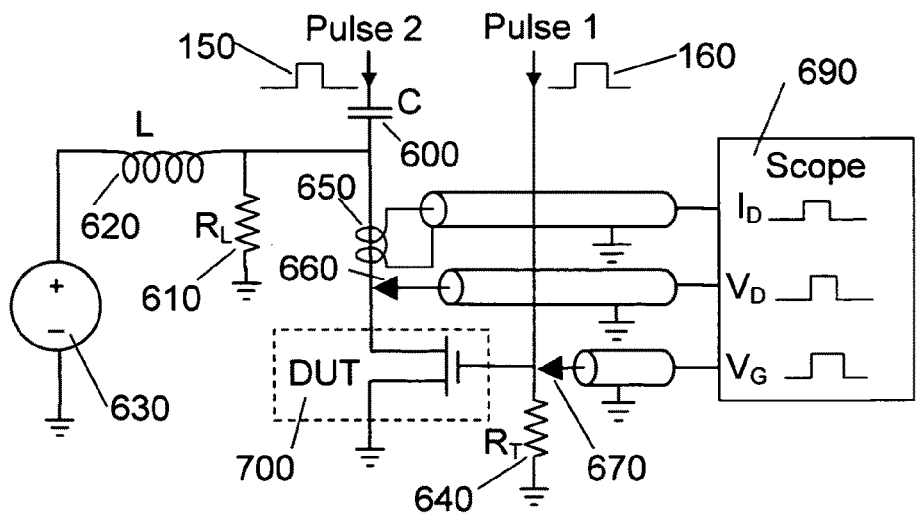
Fig. 8: An example of a transistor tester using the present invention

METHOD TO SYNCHRONIZE TWO DIFFERENT PULSE GENERATORS

CROSS REFERENCE TO RELATED APPLICATION

This application claims the benefit of U.S. Provisional Application No. 61/004,920, filed Dec. 3, 2007, which is incorporated herein by reference.

BACKGROUND OF THE INVENTION

1. Field of the Invention

The present invention relates to electronic testing equipment, and more specifically to apparatuses for generating pulses.

2. Description of the Related Art

Testing of a semiconductor device, termed a device under test (DUT), is often done to evaluate its performance. Testing equipment can be used to measure a transistor's operation by applying currents or voltages to a transistor's input (base relative to emitter of a bipolar transistor or gate relative to source of field effect transistor, or FET) and recording the transistor's output voltage and current (at the collector or drain) as it changes in response to the applied input. A "transistor curve tracer" is an example of such testing equipment. The results of such testing are often graphically presented as a curve showing the output current (I in electrical engineering notation) changes with output voltage (V) based on applied input voltage. FIG. 1 shows a family of such "I-V curves". These I-V curves display the static or DC characteristics of transistors as the applied voltages and measuring currents change slowly allowing the transistor to reach steady state for each measurement.

One limitation of I-V measurement of transistor parameters as just described is the power delivered to the transistor (product of voltages and currents) must be kept low or the temperature of the DUT will be changed due to heating from the dissipated power. Semiconductor parameters vary with temperature changes, so DUT temperature must be controlled or limited. Transistors used with a low duty cycle or in pulsed operation can be used to control high power loads, but their high power operation cannot be measured statically for the resulting heating would be excessive.

A test method termed "pulsed I-V" has been used to avoid the heating effects of the slow static or DC parameter measurements of transistor characteristics. This term is apropos as the current is determined as a function of voltage during short duration pulses applied at low duty cycles. This allows measurements to be made with little of the DUT heating that would occur with static measurements. Another use of pulsed I-V testing is to determine the DUT's high frequency response by applying a pulse to change its operation. This can be used to measure the effects of charge trapping sites that are prevalent in high frequency integrated circuits (ICs) in compound semiconductors, such as GaAs.

As transistors increase in speed, the measurements need to be made at higher speeds to measure parameters at operational frequencies. This can be accomplished by using very short pulses, such as pulses of 10 nanoseconds in duration. These fast pulses can be generated by today's pulse generators (pulsers), some of which are made themselves with high frequency transistors. All pulsers that control voltages and currents that form an output pulse using diodes and transistors of any type will be herein collectively termed "solid state pulse generators," or "solid state pulsers." Such solid state pulsers typically have features such as an external trigger or control input that can initiate the pulse generation cycle. The time between the trigger input and the leading edge of the output pulse is usually a fixed time plus a user controlled variable time delay.

One performance feature of pulsers is the slew rate, or maximum rate of change, of its output voltage transitions. For example, a 5 volt pulse leading edge that has a 10% to 90% transition time of 1 nanosecond (ns) has a 4 volt/ns slew rate. Very fast solid state pulsers have maximum slew rates approaching 20V/ns. High power solid state pulsers can produce 50 to 100V pulses into a 50 ohm cable, but the highest slew rate solid state pulsers produce less than 5 volt pulses.

These solid state pulsers, which switch electrical energy to the output using transistors, can be contrasted to pulse generators that form a pulse by switching electrical energy with a sudden spark or arc discharge. Pulsers that use electrical discharges to conduct the current that produces their outputs will be herein collectively termed "spark discharge pulse generators," or "spark discharge pulsers." An example of a spark discharge pulse generator is an electrostatic simulator as described in Military Specification MIL-STD-883C Method 3015.7 and shown in FIG. 2. In this type of pulse generator, a capacitor is used as a charge storage device which is charged over a relatively long time period to a high voltage and discharged in a very short time period to form the pulse. The pulse in this example is generated when the switch S1 is activated and the moving armature of switch S1 of FIG. 2 approaches the normally open contact of that switch, but before the armature actually contacts the normally open contact, a spark occurs within the gas between the armature and the normally open contract of the switch and the gas in the switch becomes ionized and conductive. Such spark discharges are characterized by very fast rise in current flow and moderately low resistances when a large current is flowing. Sparking or arcing will occur when the electric field strength, produced by the voltage difference between the contacts over the distance that separates them, exceeds the breakdown voltage between the contacts. This spark begins when a random free electron in the gas or fluid between the contracts is accelerated sufficiently by the electric field between the contacts to gain adequate kinetic energy that when it hits a molecule of the gas or fluid, its energy can ionize this molecule freeing another electron. When the free electron population quickly increases, an avalanche of charge carriers forms, and a spark capable of carrying the current to form a pulse is formed. When that first electron, which has been sometimes termed the 'lucky electron' begins a spark, the switch quickly changes from a non-conductive state to a highly conductive state and remains conductive while sufficient current flows to maintain the spark conditions. In the circuit of FIG. 2, the high current will slowly decay as the stored electric charge in the storage capacitor C1 is drained, and at some point in time the current through the switch will be so small that the spark extinguishes and the current through the switch quickly decreases. Spark discharges can be made with switches, relays, spark gaps, contactors, circuit breakers and similar devices. Herein the terms "spark discharge pulse generator" and "spark discharge pulser" should be understood to encompass all these types of spark generation devices and any other device that produces a high current flow when a fast increase of charge carriers is created within a solid, liquid, or gaseous material and the spark may include a plasma.

Using a spark to cause switching action has been used in prior art pulsers such as the transmission line pulser (TLP) diagramed in FIG. 3. A TLP uses a cable, or similar constant impedance conductor, which is precharged to a high voltage while isolated by a switch and then discharged when a spark in formed in the switch which connects the charged cable to the pulser output. The action of the discharge of the cable produces a rectangular pulse which is then applied to the DUT. These spark discharge pulsers can produce pulses of 500V into 50-ohm cables with less than 1 ns rise time. This is a peak power of 5,000 watts and 800 V/ns slew rate. In addition pulse widths of 10 ns and shorter can be generated. The spark discharge pulser performance parameters exceed what can be produced by today's solid state pulsers making them preferred to test high power transistors.

There are advantages and disadvantages of both the solid state and the spark discharge pulse generators. The solid state pulser is highly controllable, but has limited voltage and current capabilities. The spark discharge pulser has very high voltage and current pulses, but the timing of its pulse is not well controlled. Because the spark is started by a lucky electron beginning an avalanche of charge carriers relatively long after the mechanical switch activation time, the pulse generation from pulse-to-pulse can vary by hundreds of pulse width times. It is a purpose of the present invention to use the advantages of both types of generators to produce pulses that can be used to test modern transistors. This requires synchronization of the timing of pulses from both types of pulsers. It is a purpose of this invention to produce pulses useful in transistor and IC testing such as, but not limited to, pulsed I-V measurements.

In the present invention, a signal from the spark discharge pulser will trigger the solid state pulser. The output of the spark discharge pulser will pass through a delay cable so that its leading edge will be roughly in coincidence with the solid state pulser output leading edge. The triggering of the solid state pulser is done with a signal typically delivered via a 50-ohm cable. Most solid state pulsers can be triggered by either positive or negative going edge transitions. Some solid state pulsers have a user settable trigger voltage levels and some pulsers use standard logic levels to define the trigger levels. There are common logic level definitions that can be used to define trigger voltage levels, such as transistor-transistor logic (TTL) based on +5V power or emitter coupled logic (ECL) based on −5.2V power. New versions of ECL that are based on positive voltages can also be used. TTL has logic voltage levels with logic low usually defined as <0.8V and logic high defined as >2 volts. ECL has negative logic levels and is designed to drive into a 50 ohm ground connected terminating load with <−1.75V as logic low and >−0.9V as logic high. An advantage of using an ECL family is they are directly able to drive 50-ohm cable. It is a purpose of the present invention to provide trigger signals that are compatible with all logic levels needed to trigger solid state pulsers.

New semiconductor testers are needed with the pulse capabilities of both solid state and spark discharge pulsers. This would allow the testing of high power transistors such as those used in pulsed operation power supplies, class D amplifiers, radio transmitters and pulsed radar systems. Transistor performance in pulsed low duty cycle circuits can be measured with pulsed measurement systems to voltage and/or current levels outside the safe operating area of continuous operation of the transistor under test. Some prior art tester have pulsed both the gate and drain of MOS transistors. These testers use only solid state pulsers which can not generate the high power pulses to perform these tests on all types of DUTs.

Therefore, there is a need for new equipment and methodologies to produce testing pulses, including those of high power, from multiple sources with relative timing that is repeatable and controllable to evaluate the performance of transistors, integrated circuits (ICs), and other devices, components and subassemblies under pulsed conditions.

SUMMARY OF THE INVENTION

This invention generates multiple pulses that have leading edges coordinated in time by synchronizing the pulses from two different styles of pulse generators (pulsers) for semiconductor testing. One pulser uses spark discharge pulse generation and the other pulsers are typical solid state pulsers. The spark discharge pulser provides high power pulse generation but its pulse timing cannot be tightly controlled. The output pulse of the spark discharge pulser in this invention is split unequally, to produce a large and small pulse. The small pulse is used to trigger the solid state pulser, and the large pulse is applied to the device under test (DUT) after being delayed by traveling through a cable. The length of the delay cable is purposely made for a signal propagation delay greater than the trigger input-to-pulse output(s) delay of a solid state pulser. Variable attenuators control the trigger signal amplitude and a level shifting circuit makes the trigger signal compatible with standard logic signal levels that may be used for triggering.

The purpose of this invention is to provide two or more pulses with controlled relative timing of the start of each pulse. These pulses are used in testing electronic devices by measuring currents and voltages during short time periods. The present invention uses one spark discharge pulse generator (pulser) and one or more solid state pulsers wherein the pulses begin at approximately the same time. The advantage of this invention over prior art pulser combinations is to measure with the high currents and voltages that can be generated by spark discharge pulsers. It is a further purpose of this invention to have one pulse begin at a fixed time period before the other(s), or have the pulses occur in a predefined time sequence. For clarity the following description will focus on two pulsers, one spark discharge type and one solid state type, while it should be understood that one spark discharge pulser can be used to trigger more than one solid state pulser in the practice of this invention.

Pulsers generally can be triggered, which is the use of an electrical signal that is a command to produce a pulse. In solid state pulsers this input signal is commonly termed a trigger input or external trigger. The pulse produced has timing that is often well controlled relative to the triggering signal; the time delay between the trigger signal and the beginning of the pulse output can be 50 ns or less and with variations in relative timing (jitter) of less than 1 ns. Spark discharge pulsers can have a long delay between a trigger signal and the pulse output as they often have mechanical motions needed to produce the spark that conducts the pulse. Delay times of milliseconds and jitter of microseconds are common in spark discharge pulsers.

The present invention is a circuit that includes a spark discharge pulser, a solid state pulser, a power splitter that allows the solid state pulser to be triggered from the spark discharge pulser, and a cable that delays the pulse from the spark discharge pulser by approximately the same or greater delay as from the solid state pulser trigger input to the solid state pulser pulse output. This allows the two pulses to be delivered to the DUT at approximately the same time or with one pulse purposely slightly before the other.

The amplitude of the trigger signal from the spark discharge pulser is adjusted by a variable attenuator to a level compatible with the solid state pulser or a selected a logic level change. Proper triggering requires the trigger pulse to exceed the minimum transitions of a logic level definition, so that the trigger signal will pass through both the logic low and logic high level limits in a very short time period. The basic trigger pulse generated from the spark discharge begins and ends at zero voltage. While zero volts is a proper signal level for some logic definitions, there may be cases where an offset voltage is needed to be added to the basic trigger pulse to have it meet the required trigger pulse transition voltage levels. A DC component or offset to the trigger signal is added by using a voltage supply and a capacitor-inductor circuit. The capacitor is used to pass the high frequencies contained in the pulse for the trigger which is added to the static voltage that is provided from a DC voltage source passed through an inductor. This capacitor-inductor combination will be recognized as a "bias tee" by engineers familiar with RF circuits.

A sequence of pulse pairs with different amplitudes is needed to measure the DUT's operation over a range of currents and voltages. This is accomplished by increasing the pulse amplitude from the spark discharge pulser with a set of pulse pair measurements. When the amplitude of the spark discharge pulser is changed, the trigger signal to the solid state pulser will also change in proportion. This trigger change can be compensated by the addition of an adjustable attenuator between the power splitter, so when the amplitude of the spark discharge pulser is increased, the attenuation can be adjusted to reduce the trigger signal by the same factor, therefore maintaining the solid state pulser trigger signal at the same level.

A testing system can be assembled in several ways using two or more pulses from the apparatus of this invention. An example of connecting two pulses generated to a DUT is shown in FIG. 8, where a FET's pulsed I-V characteristics are measured.

BRIEF DESCRIPTION OF THE DRAWINGS

The present invention can be better understood with reference to the accompanying drawings, which are incorporated in and form a part of this specification, and, together with the description, serve to explain the principles of the present invention.

FIG. 1 is an example of transistor parameter measurements

FIG. 2 is a prior art spark discharge pulse generator example

FIG. 3 is a prior art simplified Transmission Line Pulser diagram

FIG. 4 is diagram of an embodiment of the present invention using two pulsers

FIG. 5 is an embodiment of the present invention with variable attenuators

FIG. 6 is an embodiment of the present invention with a level shifter added for the trigger pulse FIG. 7 is examples of resistive power splitters for constant impedance conduction paths FIG. 8 is an example of a transistor tester using the present invention

DETAILED DESCRIPTION OF THE PREFERRED EMBODIMENTS

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention. Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

In one embodiment of the present invention, shown in FIG. 4, two different types of pulsers each generate a pulse. When the spark discharge pulser 100 is triggered, such as by a controlling computer, a pulse will be generated. The output pulse of pulser 100 is split into to parts by power splitter 110. The first output of splitter 110 goes to the external trigger of solid state pulser 130. When triggered, the solid state pulser 130 will generate an output pulse 160 that is can be applied to a device under test (DUT). The second output of 110 passes through a delay cable 120 of a delay longer than the solid state pulser's time delay between trigger input and pulse output, and produces a second pulse 150 that can be applied to the DUT.

The delay cable 120 is made long enough that the pulse 160 from the solid state pulser can precede the pulse 150 that originated from the spark discharge pulser. As solid state pulsers typically have digital delays, the pulse 160 can be delayed allowing the pulses beginning edges to move in time relative to each. Either pulse can then be made to lead the other by solid state pulser delay adjustment, or the pulses can be made to coincide within the resolution of the digital delay. It is important in some transistor tests that one of the two pulses precedes the other by a certain amount, such as 5 ns or less. This can be accomplished by using a delay line length long enough to have the pulse 150 follow 5 ns after the pulse 160 when the digital delay of pulser 130 is set to minimum. Then with a delay setting between 0 and 10 ns, the two pulses can be adjusted relative to each other by ±5 ns.

External trigger inputs have voltage requirements and maximum voltage ratings that must be observed. Therefore, a fixed percentage of the spark discharge pulse output, as will be produced by the power splitter, will not be a correct trigger pulse for all amplitudes of pulses from the spark discharge pulser. As the output of pulser 100 is changed the first output of the power splitter 110 will change in proportion. Such changes are compensated by the variable attenuator 140 shown in FIG. 5. Another variable attenuator 145 is used to reduce the level of pulse 150 to extend the range of pulse amplitudes.

When a negative pulse is generated from spark discharge pulser 100 the output of splitter 110 will also be negative. It is a purpose of the present invention to adjust the trigger pulse to be compatible with the solid state pulser. In FIG. 6 another preferred embodiment is shown with more control over the trigger pulse levels. The pulse from output 1 of the splitter 110 with amplitude adjusted by attenuator 140 is coupled through capacitor 210 which passes the transitions of the pulse but not the quiescent DC level. Voltage source 230 establishes the DC level as its voltage is passed by inductor 220. The sum of the DC level of 230 and the pulse transitions of the output of attenuator 140 is applied to the external input of pulser 130. For example, if a negative 2.5V pulse is generated from attenuator 140, a DC level from 230 and 220 of +3V can be added. The result is a negative going edge from 3V to 0.5 volts is generated. When negative pulses are produced by pulser 100, a negative going trigger edge is generated for pulser 130.

Power splitters of various designs are known to electrical engineers. It should be understood that many types of splitters can be used in this invention, including, but not limited to, RF splitters, reactive splitters, Wilkinson style splitters, resistive splitters, bandpass splitters, and pickoffs. Some splitters are designed to operate with constant impedance cables on the input and all outputs. In the descriptions of the current invention 50-ohm cables and 50-ohm splitters will be used. It should be understood that cables and splitters of any impedance could be used, but as 50-ohm cables and associated components such as connectors, splitters and signal attenuators are commonly available, therefore, all such components will be shown with 50-ohm impedances for clarity. For example, three types of resistive splitters are shown in FIG. 5. A three resistor splitter in FIG. 5(a) for impedance matching will have all resistors of resistance value $R_i = Z_0/3$, where $Z_0 = 50\Omega$ is the common impedance of the cables used. In FIG. 5(a) the power from the spark discharge pulser delivered through cable 300 of impedance $Z_0$ is evenly split between the two outputs. The voltage at each output is one-half that of the input which is one-quarter of the input power delivered from each output (half of the total input power is dissipated in the three resistors). As the majority of the pulse power is desired to be delivered to cable 360 with will become the OUT 2, or Pulse A output, it is desirable to have the splitter deliver more power to its second output.

This can be done with a two resistor splitter as shown in FIG. 5(b). The input pulse is delivered to the splitter through cable 500. With resistors 310 of resistance R1 and 320 of resistance R2 with values such that $R1 \cdot R2 = Z_0^2$ and R1>R2 the splitter will have a matched input impedance and send more power to cable 460 than to cable 450. The voltage of the pulse signal delivered through cable 450 will be attenuated by an amount equal to the input voltage divided by the value of $1+(R1/Z_0)$, and the main pulse signal voltage will be attenuated from the input pulse voltage by an amount equal to the input voltage divided by the value of $1+(Z_0/R1)$. As can be seen by these attenuation factors as R1 increases more power is delivered to the cable 460 output.

When the power division ratio becomes large (R1>>R2) then the simplified splitter of FIG. 5(c), sometimes called a signal pickoff, can be used. In this configuration the signal transmitted down cable 500 is not perfectly matched to $Z_0$, and some power will be reflected back to the pulser. If the reflected power is not significant (which is true when R1 is much greater than $Z_0$), this may be the preferred splitter. With resistor 510 of resistance R1, the voltage of the pulse signal delivered through cable 550 will be attenuated by an amount equal to the input voltage divided by the value of $\frac{2}{3}+(R1/Z_0)$, and the main pulse voltage delivered through cable 560 will be attenuated from the input pulse voltage by an amount equal to the input voltage divided by the value of $(R1+3 Z_0)/(R1+2 Z_0)$.

As an alternative or in addition to a power splitter, a voltage comparator can generate a digital signal in response to the beginning of the spark discharge pulse. This digital signal can be used directly or in conjunction with a cable driving buffer. The threshold of such a comparator may need to be adjusted in accordance with the spark discharge pulser output voltage amplitude. While this will produce a trigger signal that will not need further attenuators nor level shifting, however, it will add a additional signal propagation delay. The added propagation delay can be compensated with a longer delay cable 120, but that also increases cable losses and pulse 150 may be partly degraded. Furthermore, the maximum input limits of the voltage comparator may require a switched attenuator to be added to protect the discriminator's input. One preferred embodiment is to make the trigger signal with a voltage comparator.

FIG. 8 illustrates that the two pulses generated by the previously described pulse generators can be applied to a DUT to form a test system. The transistor I-V curves of a FET drain-to-source with different gate voltages, exemplified in FIG. 1, can be generated from measurements from such a test system. In the test circuit of FIG. 8, the pulse 160 drives the transistor gate and pulse 170 drives the drain of this grounded source transistor through a coupling capacitor 600. Data can be recorded by oscilloscope 690 documenting the transistor's response to the applied pulses. The response of some transistors will be different if their voltages and currents were non-zero before the pulse. Therefore, it is desirable to have a controlled quiescent operation of the transistor DUT prior to the application of the pulses from the two pulsers. Many solid state pulsers are capable of being programmed with a DC level and will add a positive or negative pulse to that DC level when triggered. Referring to embodiment of FIG. 8, a quiescent voltage level can be applied to the FET drain and the pulse from the spark discharge pulser can be added to that quiescent level. The DC voltage level established by the voltage supply 630 is applied through inductor 620 to the parallel combination of load resistor 610 and the drain of the DUT. The pulse 150 (from the delay cable 120 in previous Figures) is added to this level by coupling capacitor 600. The combination of 600 and 620 results in passing the DC voltage of 630 and the pulse of 600 to the DUT drain. The solid state pulser output can be applied directly to the DUT transistor gate. A termination resistor 640 can be added to prevent reflections in the delivery cable providing pulse 160 to the DUT. If the solid state pulser cannot add a DC level in addition to its pulse, then a capacitor, inductor and voltage source can be added to the DUT gate, similar to components 600, 620, and 630 that adds a DC level to the DUT drain.

A digital sampling oscilloscope can be used to measure the pulses and the DUT response to them. The transistor gate voltage is recorded by a voltage probe 670 and oscilloscope 690. In order to determine the total current through the DUT the DC current from 630 should be added to the pulse current which can be measured by an inductive probe current transducer 650 and oscilloscope 690. It is common that voltage supplies can report their current via a computer bus, such as Ethernet or IEEE 488 (GPIB). Instruments are specifically designed as a voltage source with current measuring abilities, such as a source-meter unit that provides high accuracy in both the voltage supply and the current monitoring. The drain voltage can be measured directly by a voltage probe 660 and oscilloscope 690. Data gathered by this test circuit can show the operation of a DUT such as a transistor when the quiescent operation point is non-zero.

The solid state pulser in these preferred embodiments, should have the shortest time between the external trigger input and the pulse output. The longer this time period, the longer the physical delay cable 120 must be in order to have the pulse 150 initiate after the start of pulse 160. Even good quality, high frequency cables have losses, so the shorter 120 is the better for pulse 150 quality. The rise times and slew rates suffer with increased cable length.

While control of pulser amplitude, triggering levels and transition directions, time delays and other pulser parameters, attenuator settings, voltage sources, etc. can be done manually, it is more convenient to control these settings and to coordinate activities that are needed for a complete test system with a control system such as a computer. A controlling system or computer is not shown in FIGS. 4, 5, 6 and 8 for clarity, however the use of such a controller is common in testing systems, and should be understood as a part of this invention.

What is claimed is:

1. A pulse generating apparatus comprised of:
   a first pulse generator wherein spark discharges conduct current to its output;
   a second pulse generator having an input and output, operable to produce output pulses that begin at an approximately fixed time period after input signals, wherein semiconductor devices conduct current its output;
   a pulse splitter having one input and first and second outputs operable to divide a pulse delivered to its input into two synchronized pulses at its outputs wherein each output pulse is an approximate replica of the input pulse reduced in amplitude by approximately constant factors, and having its input connected directly or through an electrical signal path to the output of said first pulse generator;
   a signal cable connecting the first output of said pulse splitter to the input of said second pulse generator; and
   a delay cable with input connected to the second output of said power splitter and an output.

2. The apparatus of claim 1 with the addition of:
   a device to be tested (DUT) with a plurality of terminals;
   connecting cables of approximately constant impedance connecting pulses from said delay cable output and said second pulser output to terminals of the device to be tested; and
   voltage and/or current measuring and recording equipment operable to determine the voltage(s) and/or current(s) of the DUT during the time that pulses are applied to the DUT.

3. The apparatus of claim 1 wherein said delay cable has a signal propagation time from input to output approximately equal the period of time from the beginning of a pulse from the first output of said pulse splitter to the beginning of a pulse output of said second pulse generator, thereby causing the beginning of output pulses from said delay cable to be approximately coincident in time with the beginning of output pulses from said second pulse generator.

4. The apparatus of claim 1 wherein said second pulse generator has a selectable time delay range from its input to the beginning of its output pulse, and further wherein said delay cable has a signal propagation time from input to output so that the beginning of pulses output from said second pulse generator can be selected to precede or follow the beginning of the pulse outputs from said delay cable.

5. The apparatus of claim 1 wherein said first pulse generator is a transmission line pulser.

6. The apparatus of claim 1 wherein said pulse splitter is comprised of three resistors connected in a star configuration, with all three resistors sharing a common connection at one end of each resistor, and the other three resistor ends forming the input and the two outputs.

7. The apparatus of claim 1 wherein said pulse splitter has unequal amplitude reduction factors at its two outputs.

8. The apparatus of claim 7 wherein said pulse splitter is comprised of two resistors sharing a common connection at one end of each resistor, and the common connection being the input and the other ends of the resistors being the two outputs.

9. The apparatus of claim 8 wherein said signal and delay cables have approximately the same impedance as the output of the first pulse generator, and further wherein the product of the two resistor values comprising said splitter approximately equals the square of the common impedance value of said signal and delay cables.

10. The apparatus of claim 7 wherein said pulse splitter is comprised of one resistor with said input and said second output connected together with one end of the resistor, and the other end of the resistors being said first output.

11. The apparatus of claim 1 wherein a signal attenuator is added into one end of said signal cable operable to reduce the amplitude of all signals from said power splitter to said solid state generator by an approximately constant attenuation factor.

12. The apparatus of claim 11 wherein said signal attenuator has an adjustable attenuation factor operable to set the signal amplitude compatible with said second pulser input when the amplitude of the signal from said pulse splitter first output varies.

13. The pulse generating apparatus as recited in claim 12 with the addition of:
    a voltage source;
    a bias tee with three connections, where one connection is DC blocking and connected directly or through cables and/or attenuators to said power splitter first output, and another connection is AC blocking and connected to said voltage source, and a summing connection is connected directly or through cables to said second pulse generator input; and
    is operable to set a signal amplitude and voltage levels compatible with said second pulser input.

14. The apparatus as recited in claim 2 with the addition of:
    a voltage source, and
    a bias tee with three connections, where one connection is DC blocking and connected to said delay cable output, and another connection is AC blocking and connected to said voltage source, and a summing connection is connected to said DUT; and
    is operable to set a non-zero voltage level at said DUT before pulses are applied.

15. The apparatus of claim 1 wherein a power attenuator, or attenuators, is added to one end of said delay cable.

16. The apparatus of claim 1 with the addition of a control system to coordinate the operation of apparatus components.

17. The apparatus of claim 2 with the addition of a control system to coordinate the operation of apparatus components.

* * * * *